United States Patent
Lee et al.

(10) Patent No.: US 7,373,367 B2
(45) Date of Patent: May 13, 2008

(54) EFFICIENT DIGITAL FILTER DESIGN TOOL FOR APPROXIMATING AN FIR FILTER WITH A LOW-ORDER LINEAR-PHASE IIR FILTER

(75) Inventors: Herng-Jer Lee, Tao-Yuan (TW); Chia-Chi Chu, Tao-Yuan (TW); Wu-Shiung Feng, Tao-Yuan (TW)

(73) Assignee: Chang Gung University, Tao-Yuan (TW)

( * ) Notice: Subject to any disclaimer, the term of this patent is extended or adjusted under 35 U.S.C. 154(b) by 749 days.

(21) Appl. No.: 10/827,504

(22) Filed: Apr. 19, 2004

(65) Prior Publication Data

US 2005/0235023 A1    Oct. 20, 2005

(51) Int. Cl.
*G06F 17/10* (2006.01)

(52) U.S. Cl. .................................. 708/300; 708/304

(58) Field of Classification Search ............... 708/300, 708/304

See application file for complete search history.

(56) References Cited

OTHER PUBLICATIONS

Herng-Jer Lee, Chia-CHi Chu, and Wu-Shiung Feng; Inteligent multipoint Arnoldi (IMA) approximations of FIR order linear-phase IIR filters; May 26-29, 2002; Dept. of Electr. Eng., Chang Gung Univ., Taoyuan, Taiwan; Circuits and Systems, 2002. ISCAS 2002. IEEE International Symposium on; vol. 1; p. I-417-I-420.*

* cited by examiner

*Primary Examiner*—Meng-Al T. An
*Assistant Examiner*—Michael Yaary
(74) *Attorney, Agent, or Firm*—Mark A. Mersereau; Nikolai & Mersereau, P.A.

(57) ABSTRACT

A method and apparatus for designing low-order linear-phase IIR filters is disclosed. Given an FIR filter, the method utilizes a new Krylov subspace projection method, called the rational Arnoldi method with adaptive orders, to synthesize an approximated IIR filter with small orders. The method is efficient in terms of computational complexity. The synthesized IIR filter can truly reflect essential dynamical features of the original FIR filter and indeed satisfies the design specifications. In particular, the linear-phase property is stilled remained in the passband.

1 Claim, 13 Drawing Sheets

EFFICIENT DIGITAL FILTER DESIGN TOOL FOR APPROXIMATING AN FIR FILTER WITH A LOW-ORDER LINEAR-PHASE IIR FILTER

BACKGROUND OF THE INVENTION

1. Field of the Invention

The present invention relates to a method of designing digital filters, and more particularly, to a method of designing low-order linear-phase IIR filters for approximating an FIR filter.

2. Description of Related Art

Digital filters for addressing digital signal processing have been applied widely in commercial electronic products, such as compact disk players, television sets and the like. In order to deal with real-time signals, the designs should be considered low computational costs to output signals efficiently. Also, since the distortion-free transmission of the waveforms in the passband is very important in signal processing, the filters should contain a linear-phase characteristic, i.e., constant group delay.

There are two classes of digital filters. One is a finite-duration impulse response (FIR) filters and the other is an infinite-duration impulse response (IIR) filters. The main advantages of the FIR filters are exactly linear phase and guaranteed stable. However, when the specification being very rigorous, the resulting FIR filter is usually with higher orders, which may require more hardware components and lower the operational speed. Conversely, the IIR filters are useful for large-scale or high-speed designs but they do not have exactly linear phase and can not guarantee to be stable.

One way to synthesize the IIR filters with linear phase in passband is to solve the rational approximation problem directly. These methods, for example, include Pade approximation, linear programming, nonlinear programming, multiple criterion optimization and eigenfilter approach.

Another way is called the indirect approach. It will be composed of three steps, as shown in FIG. 1. Step 1 receives and stores the design specifications of a digital filter.

These specifications are required in the frequency-domain in terms of the desired magnitude and phase response of the filter. Then, a linear-phase FIR filter, which meets design specifications, will be designed in step 2. The order and the coefficients of the FIR filter can be obtained using the conventional methods such as the frequency-sampling design technique, the window design technique and the optimal equiripple design technique. Finally, a lower-order IIR filter will be obtained using filter approximation techniques in step 3. It should be mentioned that the special attentions shall be paid on this indirect approach. The resulting IIR filter must be ensured to capture the linear-phase response of the original FIR filter in the passband.

In recent years, several linear-phase IIR filter design techniques have been emerged for this purpose. Generally speaking, two distinct methods have be proposed: (1) Grammian-Based Methods: including the balanced truncation method and impulse response grammian method and (2) Optimal Approximation Methods: including the least-square approximations and the $H_2$ norm approximation. Although satisfactory results have been reported, computational complexity of these methods are still quite expensive.

SUMMARY OF THE INVENTION

The main objective of the present invention is to provide a water-preventing grommet for a pull chain switch, which efficiently keeps water out of the pull chain switch to avoid malfunction.

The secondary objective of the present invention is to provide a water-preventing grommet for a pull chain switch, which smoothes operations of the pull chain switch.

To achieve the objectives, the method of approximating an FIR filter with low-order linear-phase IIR filters by the rational Arnoldi algorithm with adaptive orders in accordance with the present invention contains the following steps:

(a) initialize the first vector of the Krylov sequence for each expansion point;

(b) in the jth iteration of the algorithm, choose an expansion frequency such that the frequency gives the greatest difference between the (j+1)st-order output moment of the original FIR filter H(z) and that of the lower-order IIR filter $\hat{H}(z)$;

(c) after the chosen expansion point in jth iteration being determined, the single-point Arnoldi method applied at the expansion point to generate the new orthnormal vector;

(d) determine the new residual at each expansion point for the next iteration; wherein the resulting orthogonal projection matrix is output after giving the total iteration number of the algorithm.

DETAILED DESCRIPTION OF THE PREFERRED EMBODIMENT

Figure 1:
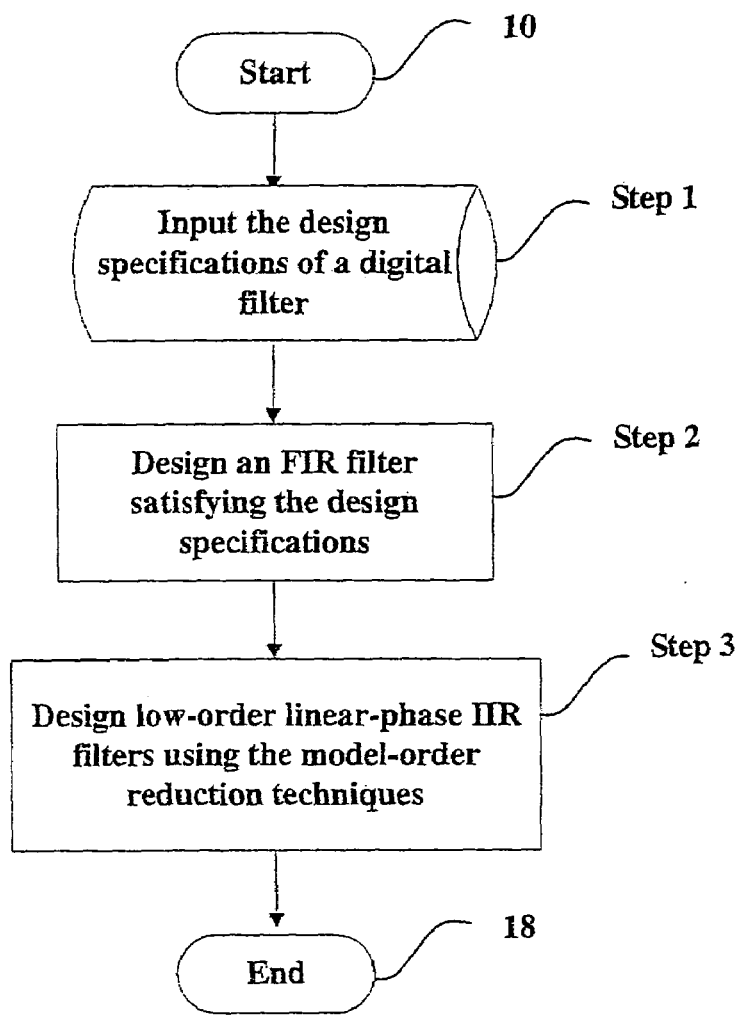
FIG. 1 illustrates an indirect approach to design a low-order linear-phase IIR filter.
Figure 2:
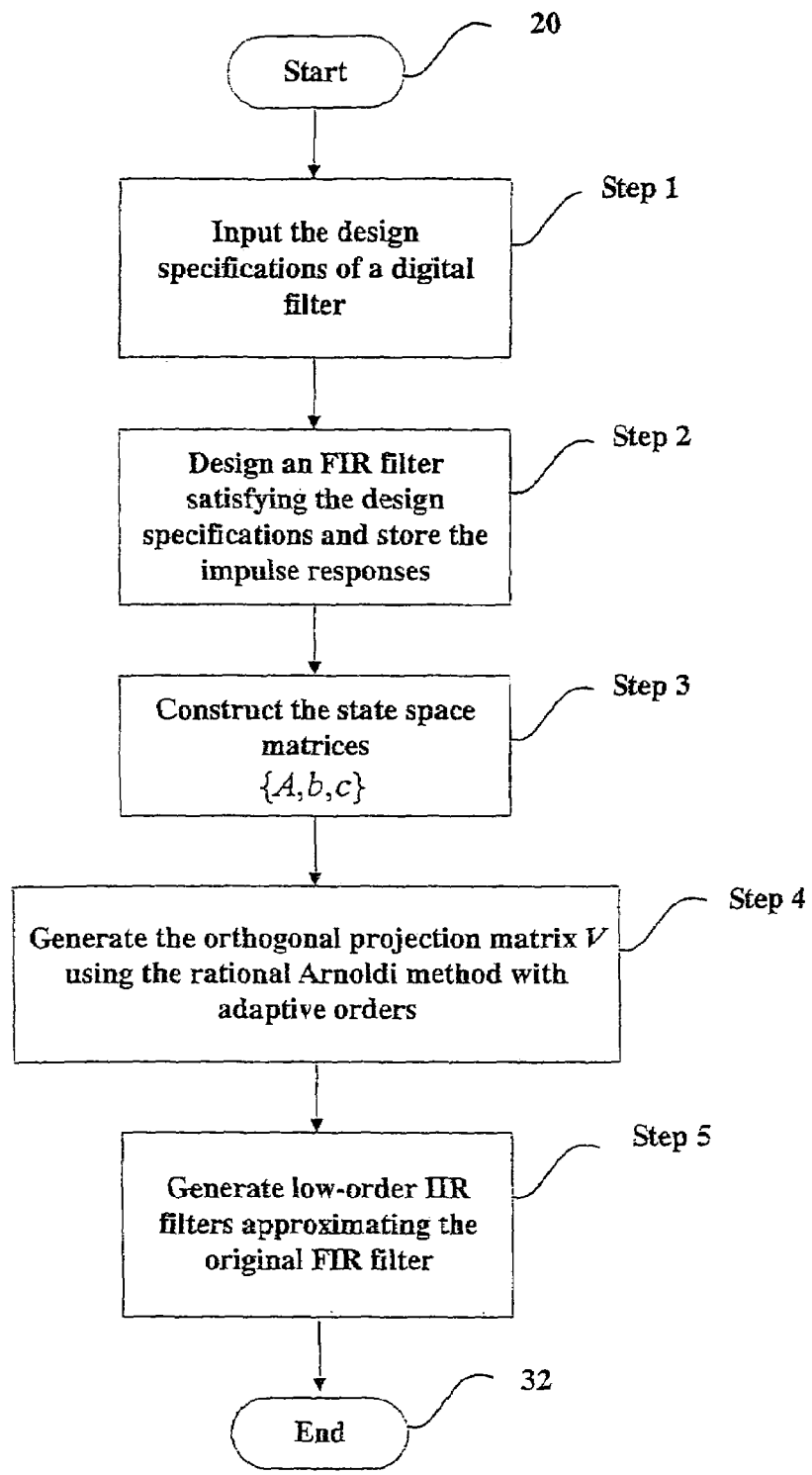
FIG. 2 illustrates the design flow of the low-order linear-phase IIR filters.

FIG. 2 shows the design flow of a low-order linear-phase IIR filter in the present invention in which includes the steps of receiving and storing the design specifications in step 1, designing an FIR filter satisfying the design specifications and saving the order and coefficients in step 2, establishing the state space matrices {A,b,c} in step 3, performing the rational Arnoldi method with adaptive orders and produce the orthogonal projection matrix V in step 4, and generating the corresponding low-order linear-phase IIR filter, which can approximate the original FIR filter and satisfy the design specifications in step 5.

Figure 3:
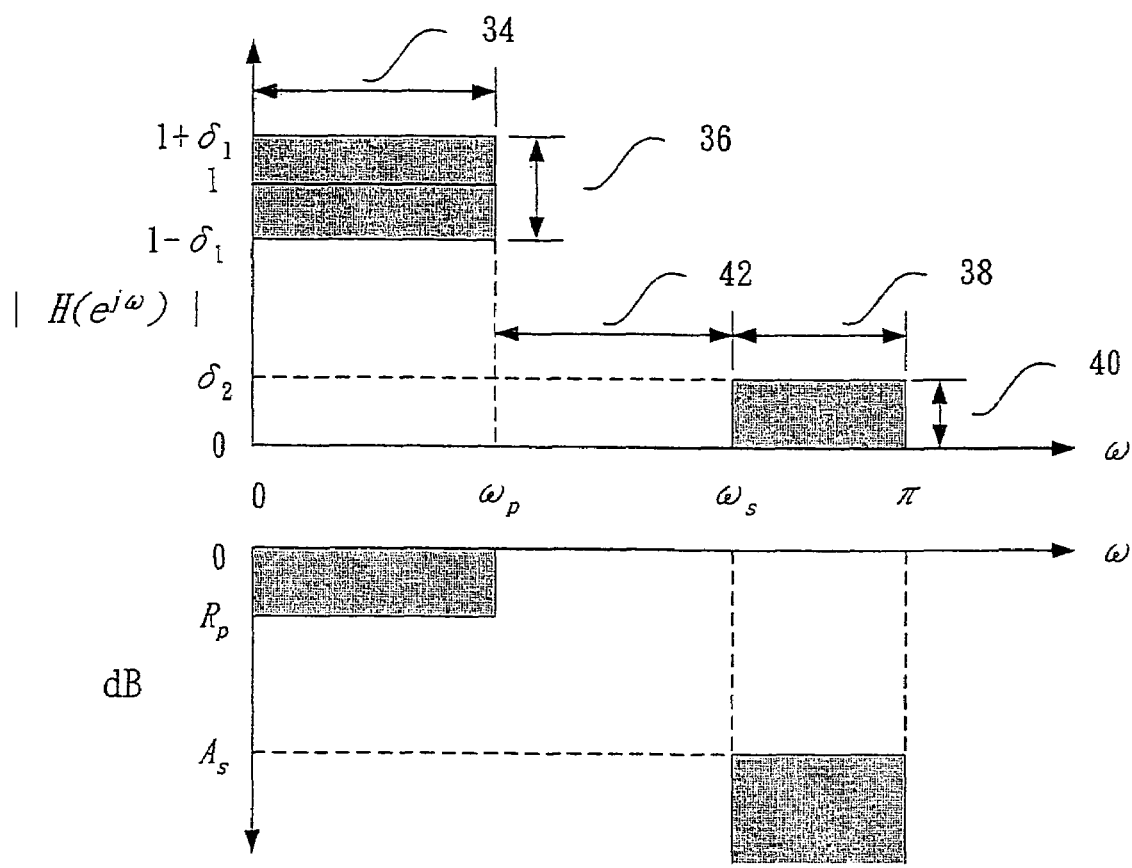
FIG. 3 illustrates the typical design specifications of a low-pass filter.

FIG. 3 illustrates typical design specifications of a low-pass filter in step 1, where the band $[0,\omega_p]$ (unit 34) is called the passband and $\delta_1$ (unit 36) is the acceptable tolerance (or ripple) in the passband, the band $[\omega_s,\pi]$ (unit 38) is called the stopband and $\delta_2$ (unit 40) is the corresponding tolerance (or ripple), and the band $[\omega_p,\omega_s]$ (unit 42) is called the transition band. $R_p$ is the passband ripple in dB, where $R_p = -20 \log_{10}[(1-\delta_1)/(1+\delta_1)]$. $A_s$ is the stopband attenuation in dB, where $A_s = -20 \log_{10}[\delta_2/(1+\delta_1)]$. Notably, either $\{\delta_1,\delta_2\}$ or $\{R_p, A_s\}$ is required to be stored in step 1.

Suppose that an FIR filter has been designed to satisfy the design specifications in step 2. Let $H(z)=\sum_{i=0}^{n} h_i z^{-i}$ be the causal FIR filter with length n+1. A state-space realization of H(z) in step 3 can be described as $$x(k+1) = Ax(k) + bu(k) \quad (1)$$
$$y(k) = c^T x(k) + h_0 u(k)$$

where $$A = \begin{bmatrix} 0 & 0 & \cdots & 0 & 0 \\ 1 & 0 & \cdots & 0 & 0 \\ 0 & 1 & \cdots & 0 & 0 \\ \vdots & \vdots & \vdots & \vdots & \vdots \\ 0 & 0 & \cdots & 1 & 0 \end{bmatrix}, \quad b = \begin{bmatrix} 1 \\ 0 \\ \vdots \\ 0 \end{bmatrix}, \quad c = \begin{bmatrix} h_1 \\ h_2 \\ \vdots \\ h_n \end{bmatrix}, \quad (2)$$

and $A \in R^{n \times n}$, $b \in R^n$, $c \in R^n$. The transfer function H(z) can also be expressed as $H(z)=c^T X(z)+h_0=c^T(zI_n-A)^{-1}b+h_0$. Our problem formulation is to find a lower-order IIR filter $\hat{H}(z)$, which satisfies the same specifications in step 1 as the original FIR filter H(z) and maintains a linear-phase response in the passband.

The way in the invention is to find an optimal IIR filter by using orthogonal projection of the original FIR filter. By matching some characteristics of the original FIR filter, the resulting orthonormal matrix V can be generated in step 4. The lower-order IIR filter $\hat{H}(z)$ can be constructed using the orthonormal projection $x(k)=V\hat{x}(k)$. In such a situation, the parameters of the IIR filter can be defined by the following congruence transformation in step 5, $$\hat{A}=V^T AV, \quad \hat{b}=V^T b, \text{ and } \hat{c}=V^T c. \quad (3)$$

It can be shown that the matrix $V^T AV$ is always stable as long as (1) and matrix A is stable, (2) $V^T V=I$. Thus, the stability of the lower-order IIR filter generated by Eq. (3) is guaranteed.

Pade Approximation and Moment Matching

The basis theory of the method in the invention is the multi-point Pade approximation, or so called the multi-point moment matching, to obtain a low-order IIR filter. Expanding X(z) in power series about various frequencies $\{z_1, z_2, \ldots, z_{\hat{i}}\}$, where each $z_i=e^{j\omega_i} \in C$ and $0 \leq \omega_i \leq \pi$, we have $$X(z) = \sum_{j=0}^{\infty} X^{(j)}(z_i)(z-z_i)^j, \quad (4)$$

where $$X^{(j)}(z_i) = [-(z_i I_n - A)^{-1}]^j (z_i I_n - A)^{-1} b, \quad (5)$$
$$H^{(j)}(z_i) = c^T X^{(j)}(z_i) \quad (j>0),$$
$$H^{(0)}(z_i) = c^T X^{(0)}(z_i) + h_0.$$

$X^{(j)}(z_i)$ is called the jth-order system moment of X(z); $H^{(j)}(z_i)$ represents the jth-order output moment of H(z) at $z_i$. Notably, if $\hat{i}=1$, Eq. (4) is indeed the conventional Pade approximation. The objective is to find a q-order (q<n) IIR filter $\hat{H}(z)=\hat{c}^T(zI_q-\hat{A})^{-1}\hat{b}+h_0$ such that $H^{(j)}(z_i)=\hat{H}^{(j)}(z_i)$ for $j=0,1,\ldots,\hat{j}_i-1$ and $i=1,2,\ldots,\hat{i}$, where $q=\sum_{i=1}^{\hat{i}} \hat{j}_i$.

It shall be mentioned that moment calculations can be obtained analytically by exploring special characteristics of matrices A and b in eq. (2). For each $z_i$, $(z_i I_n-A)^{-1}b$ and $(z_i I_n-A)^{-1}$ can be derived analytically as the following formulas:

$$(z_i I_n - A)^{-1} = \begin{bmatrix} 1/z_i & 0 & \cdots & 0 & 0 \\ 1/z_i^2 & 1/z_i & \cdots & 0 & 0 \\ 1/z_i^3 & 1/z_i^2 & \cdots & 0 & 0 \\ \vdots & \vdots & \vdots & \vdots & \vdots \\ 1/z_i^{n-1} & 1/z_i^{n-2} & \cdots & 1/z_i & 0 \\ 1/z_i^n & 1/z_i^{n-1} & \cdots & 1/z_i^2 & 1/z_i \end{bmatrix},$$

$$(z_i I_n - A)^{-1} b = \begin{bmatrix} 1/z_i & 1/z_i^2 & \cdots & 1/z_i^n \end{bmatrix}^T.$$

Krylov Subspace and the Arnoldi Method

Explicitly computing moments usually yields numerically ill-conditioned problems. We adapt recent works about the Krylov space method to solve these problems. Given a square matrix $\Psi \in C^{n \times n}$ and a vector $\xi \in C^n$, the qth Krylov sequence $$K_q(\Psi, \xi) \equiv \text{span}(\xi, \Psi\xi, \Psi^2\xi, \ldots, \Psi^{q-1}\xi)$$

is a sequence of q column vectors and the corresponding column space is called the qth Krylov subspace. Set $\Psi=(z_i I_n-A)^{-1}$ and $\xi=(z_i I_n-A)^{-1}b$. It has been shown that the Krylov subspace $K_q(\Psi,\xi)$ is indeed spanned by the system moments $X^{(j)}(z_i)$ for $j=0,1,\ldots,q-1$. The Arnoldi method, a kind of Krylov subspace methods, is employed to generate an orthonormal matrix $V_q$ that spans the same subspace as the Krylov subspace $K_q(\Psi,\xi)$. As a result, the guaranteed stable IIR filter can be constructed by substituting $V_q$ into Eq. (3).

The Arnoldi method arises from the Hessenberg reduction $A=VHV^T$ for eigenvalue calculations. It has the advantage that it can be terminated part-way and leaving one with a partial reduction to a Hessenberg form. The process is exploited to form iterative algorithms. During the iteration process, an upper Hessenberg matrix $H_q \in C^{q \times q}$ is generated that satisfies the following relationship:

$$\Psi V_q = V_q H_q + h_{q+1,q} v_{q+1} e_q^T \text{ and } v_1 = \xi/\|\xi\|, \quad (6)$$

where $e_q$ is the qth unit vector in $R^q$. The vector $v_{q+1}$ satisfies a (q+1)-term recurrence relation, involving itself and the preceding Krylov vectors. A new orthonormal vector $v_{q+1}$ can be generated using the modified Gram-Schmidt orthogonalization technique.

The Rational Arnoldi Method

Generally speaking, the accuracy of the Pade approximation based methods is lost away from the expansion point more rapidly as the eigenvalues of the FIR filter approach the expansion frequency. A rational Arnoldi (RA) method, which uses multiple expansion points, was developed to overcome this difficulty. The straightforward way for multi-point moment matching applications is to apply the Krylov subspace algorithm at various expansion frequencies. This is the so-called rational Krylov algorithm. Basically, this algorithm is a generalization of the shifted-and-inverted Arnoldi algorithm. To simplify the developments, the number of the matched moments of the lower-order IIR filter at each expansion point is assumed to be fixed. Formally, let $Z=\{z_1, z_2, \ldots, z_{\hat{i}}\}$ represent the set of predetermined expansion frequencies. Let $J=\{\hat{j}_1, \hat{j}_2, \ldots, \hat{j}_{\hat{i}}\}$ be the set of the number of the matched moments at each corresponding frequency.

The rational Arnoldi method will generate a lower-order IIR filter $\hat{H}(z)$, which matches q-order ($q=\sum_{i=1}^{\hat{i}}\hat{j}_i$) moments of the FIR filter, H(z), at the expansion points $z_i$, i=1,2, ..., $\hat{i}$.

Implementing the rational Arnoldi method is equivalent to implement the Arnoldi method $\hat{j}_i$ times at $\hat{i}$ expansion frequencies. That is, the first $\hat{j}_1$ iterations correspond to the expansion frequency $z_1$ and the next $\hat{j}_2$ iterations are associated with $z_2$, and so on. Each Arnoldi iteration generates $\hat{j}_i$ orthonormal vectors. Then, $V_q=[v_1\ v_2\ \ldots\ v_q]$ is the desired orthonormal matrix generated from a union Krylov space at various expansion points, as stated by $$K_q = \text{span}(X^{(0)}(z_1), \ldots, X^{(\hat{j}_1-1)}(z_1), \ldots, X^{(0)}(z_{\hat{i}}), \ldots, X^{(\hat{j}_{\hat{i}}-1)}(z_{\hat{i}})).$$

Once the orthonormal matrix $V_q$ has been formed by applying the rational Arnoldi method and the lower-order IIR filter can be obtained using the congruence transformation.

The Rational Arnoldi Method with Adaptive Orders

Selecting a set of expansion points $z_i$ for i=1,2, ..., $\hat{i}$ and the number of matched moments $\hat{j}_i$ about each $z_i$ is by no means trivial. For simplicity, the expansion points $z_i$ for i=1,2, ..., $\hat{i}$ are determined in advance using engineering heuristics or experimental measurements over a specified frequency range. This invention describes an intelligent scheme for choosing multiple expansion points in each of the iterations.

Suppose that $H^{(j)}(z_i)=\hat{H}^{(j)}(z_i)$ for j=0,1, ..., $\hat{j}_i-1$ and i=1,2, ..., $\hat{i}$ after q iterations of the rational Arnoldi algorithm. However, the $\hat{j}_i$th-order output moments $H^{(\hat{j}_i)}(z_i)=\hat{H}^{(\hat{j}_i)}(z_i)$ can not be guaranteed. The concept that underlies the rational Arnodli method with adaptive orders is to select an expansion point $z_{i^*_{q+1}}$ in the (q+1)st iteration. Hence, the resulting (q+1)st-order IIR filter yields the greatest moment improvement $|H^{(\hat{j}_i)}(z_i)-\hat{H}^{(\hat{j}_i)}(z_i)|$ of the qth-order IIR filter as $z_i=z_{i^*_{q+1}}$. The moment errors can be directly obtained in the new iteration without explicitly calculating system moments.

Figure 4:
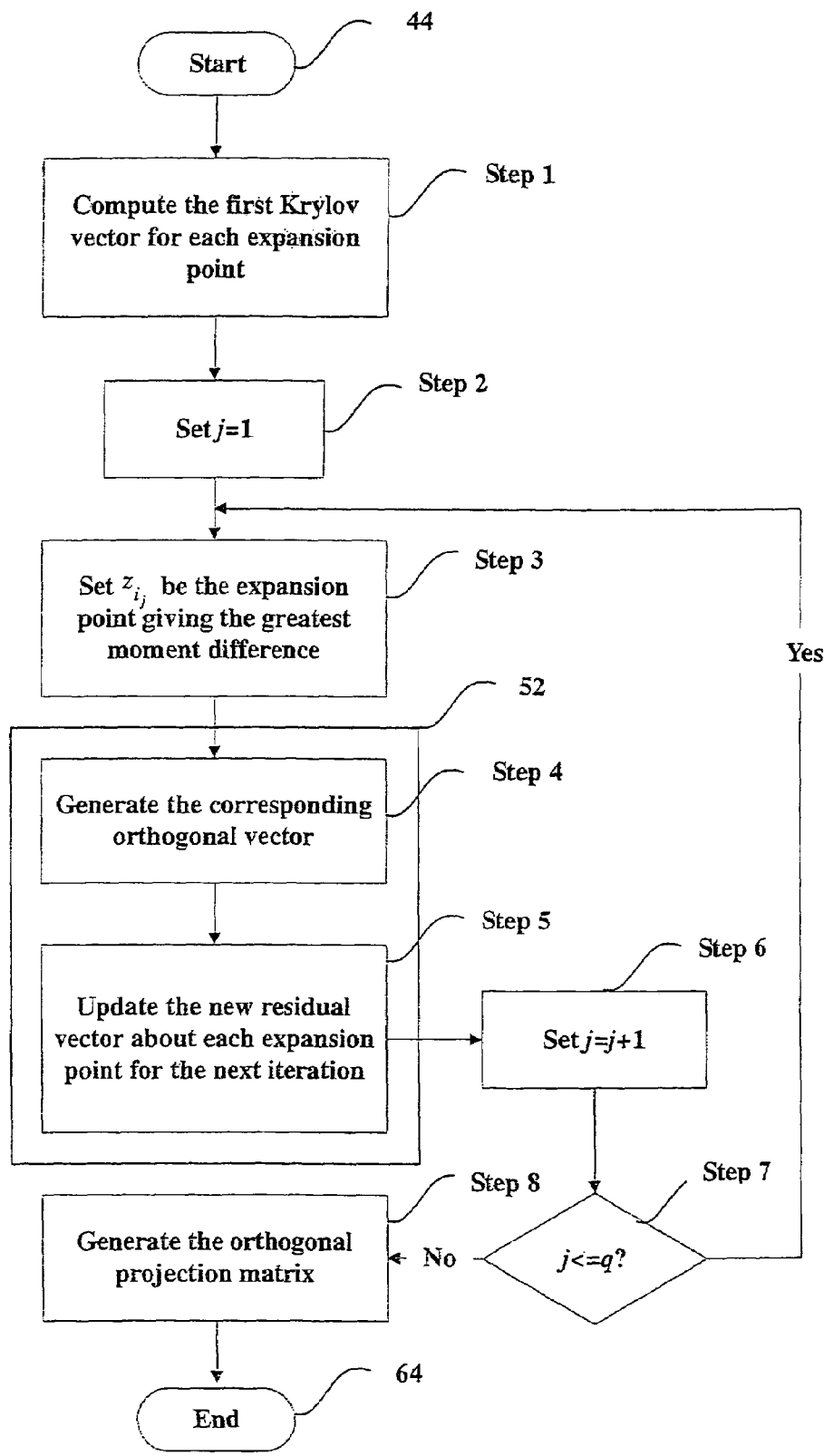
FIG. 4 shows the detail flow of the rational Arnoldi method with adaptive orders.
Figure 5A:
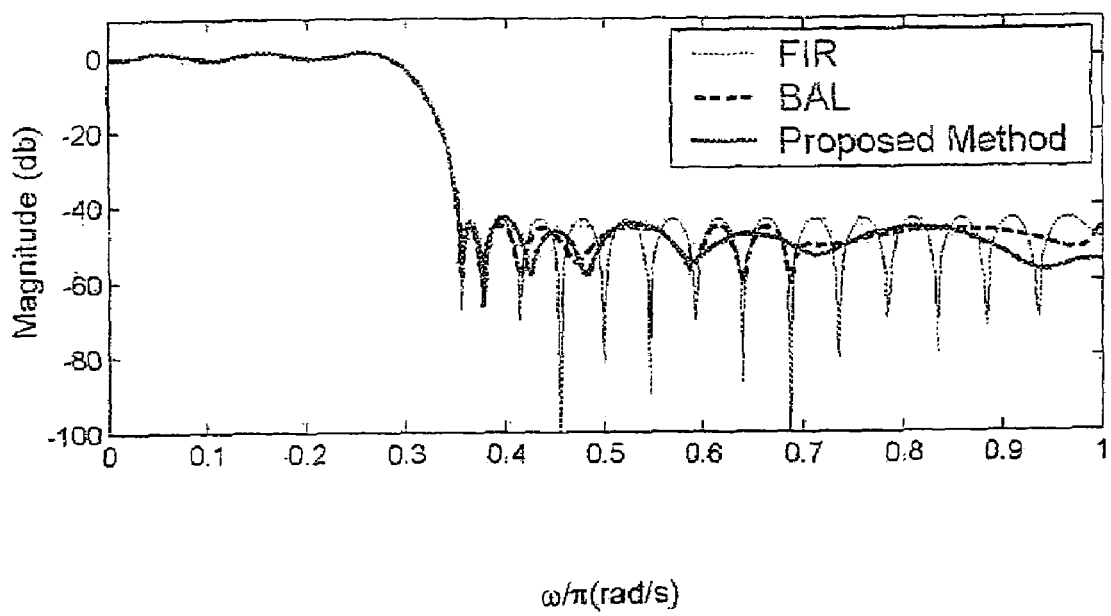
FIGS. 5A-7C show the bode plots of the magnitude, the error in magnitude, and the phase of the original FIR filters and the low-order IIR filters.
Figure 5B:
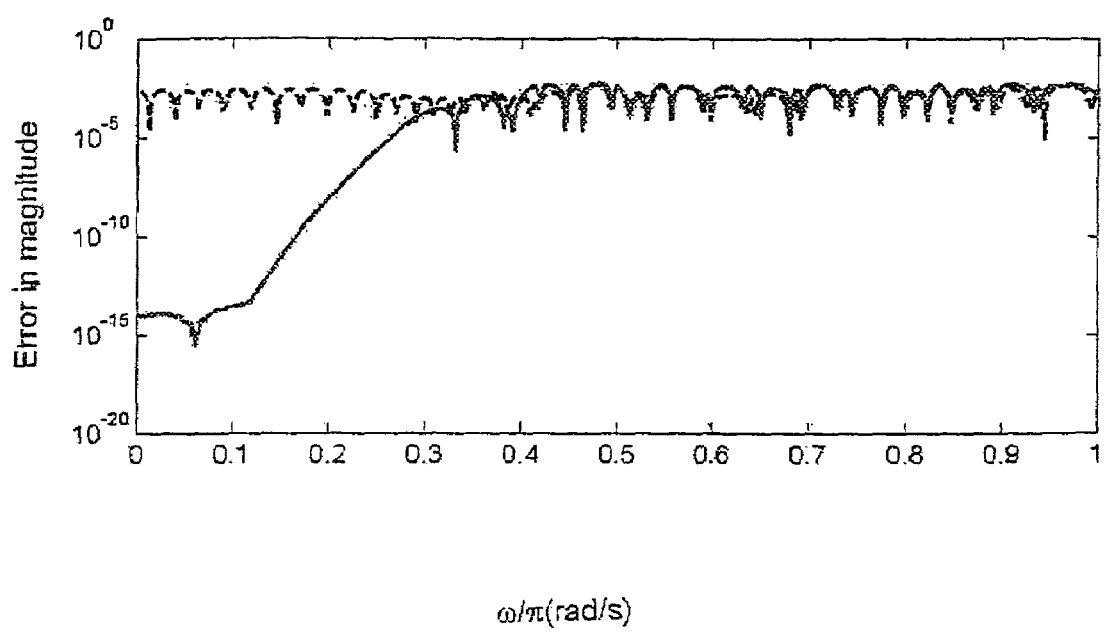
Figure 5C:
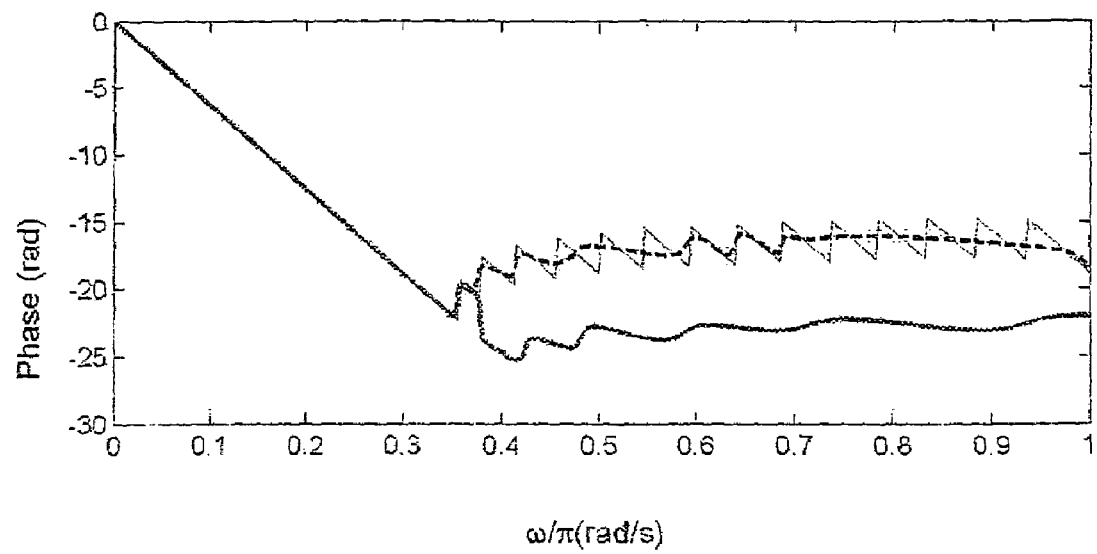
Figure 6A:
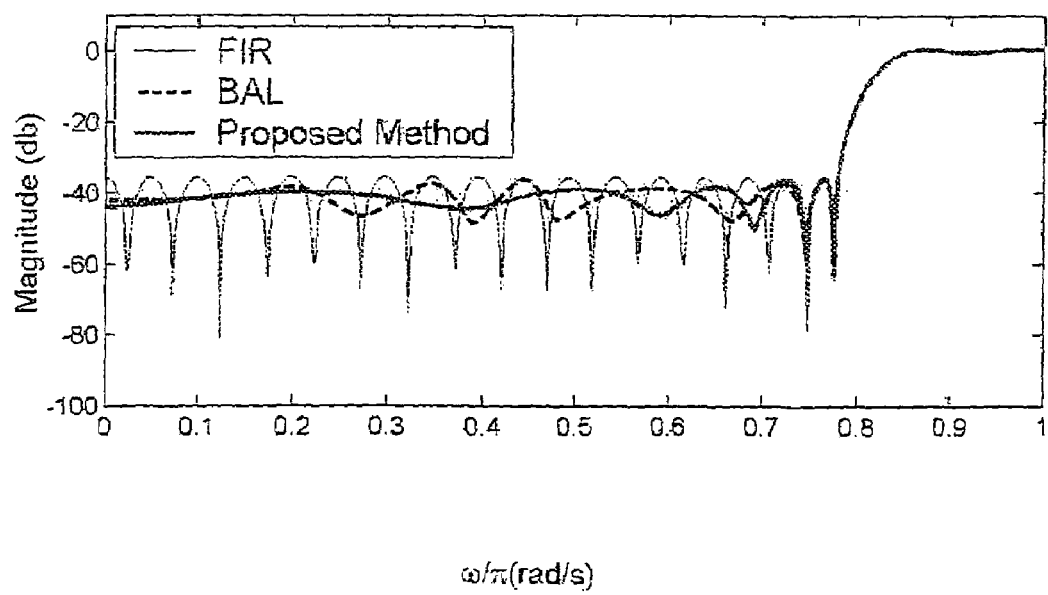
Figure 6B:
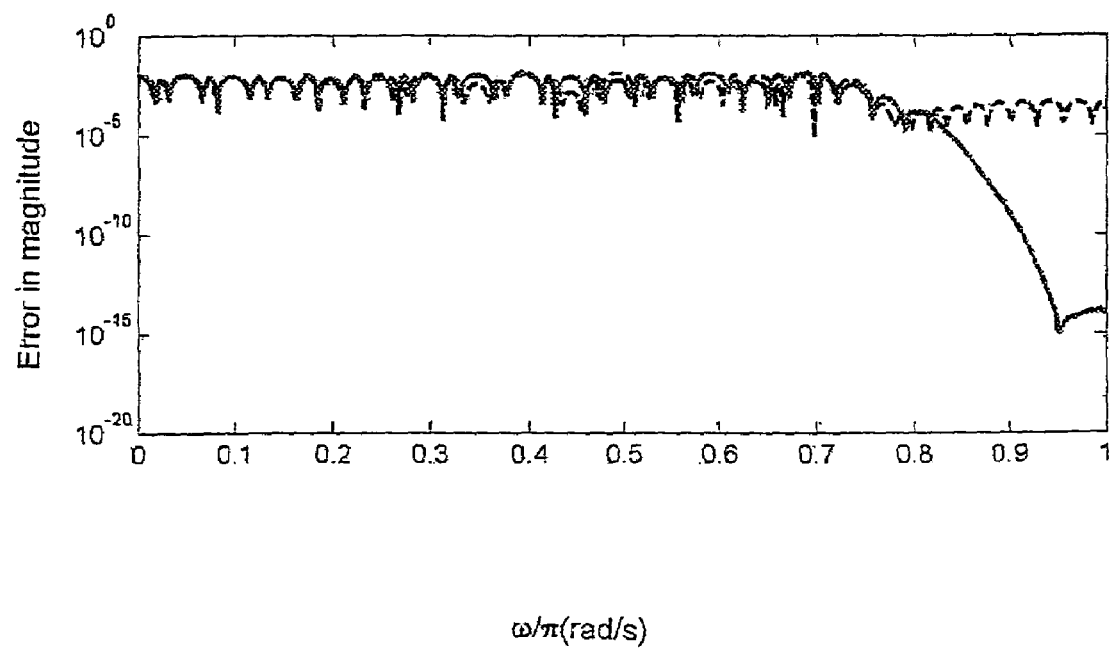
Figure 6C:
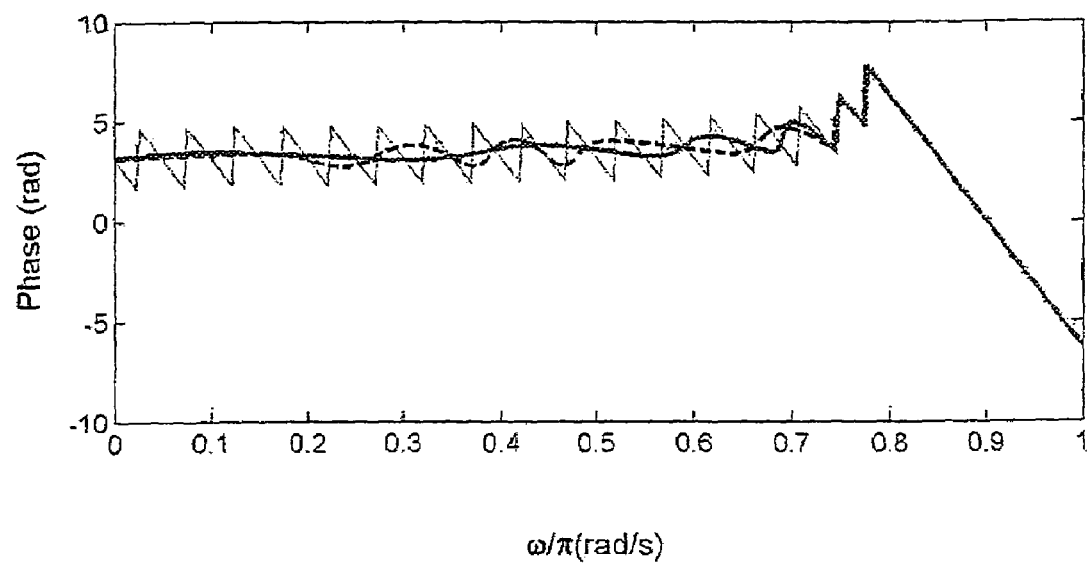
Figure 7A:
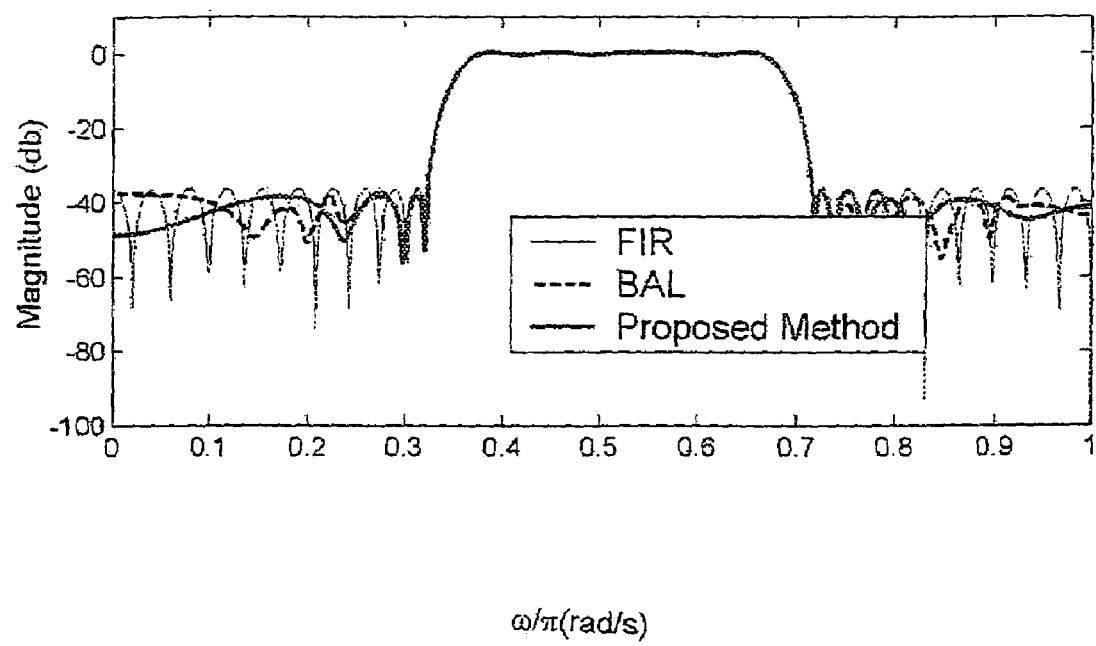
Figure 7B:
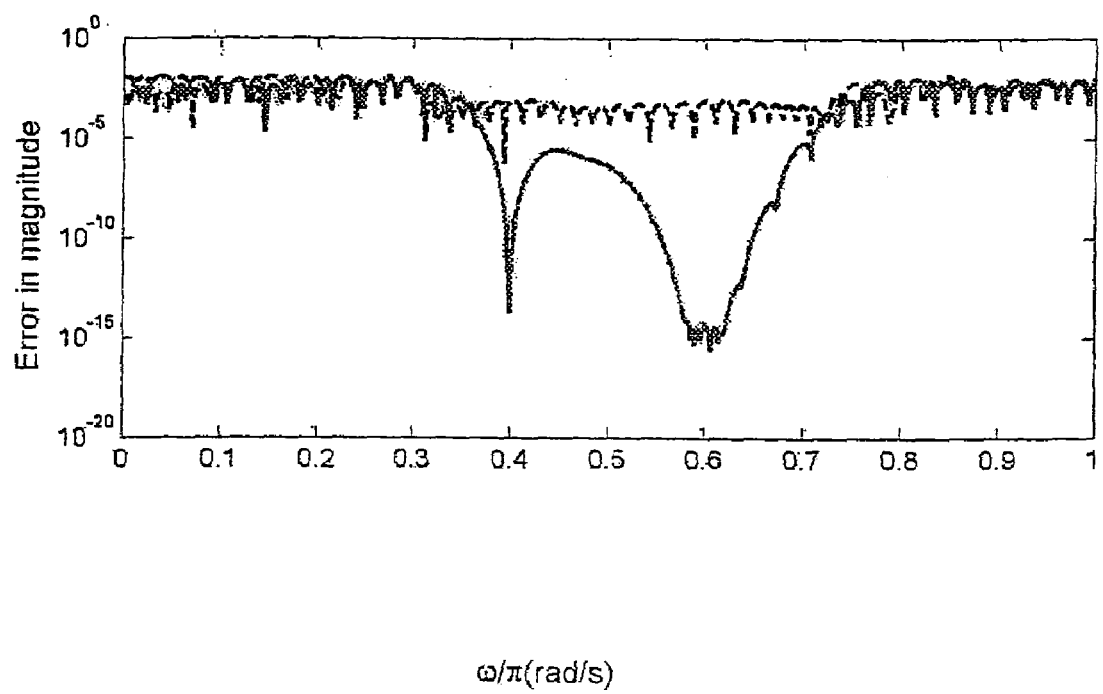
Figure 7C:
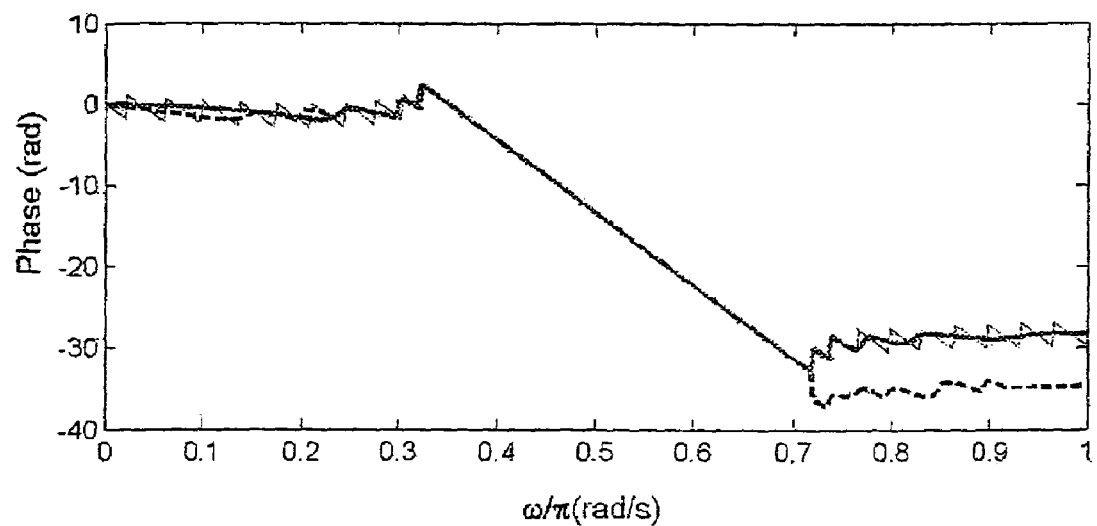

FIG. 4 displays the detail flow of the rational Arnoldi method with adaptive orders in step 4 in FIG. 2.

Step 1, in FIG. 4, initializes the first vector $k^{(0)}(z_i)=(z_i I_n - A)^{-1} b$ of the Krylov sequence for each expansion point $z_i$, where $i \in \{1, \ldots, \hat{i}\}$. Since the lower-order IIR filter and the orthonormal matrix are not yet determined, the residue $r^{(0)}(z_i)$ for each $z_i$ is set to $k^{(0)}(z_i)$. The normalization coefficient about each $z_i$, $h_\pi(z_i)$, is initialized to be one. Step 2, in FIG. 4, begins the iterations and sets j=1.

Step 3, in FIG. 4, chooses an expansion frequency $z_i$ such that $z_i$ gives the greatest difference between the (j+1)st-order output moment of the original FIR filter H(z) and that of the lower-order IIR filter $\hat{H}(z)$, that is, $$\max_{z_i \in Z} |H^{(j+1)}(z_i) - \hat{H}^{(j+1)}(z_i)| = \max_{z_i \in Z} |h_\pi(z_i) c^T r^{(j-1)}(z_i)|.$$

$\hat{H}^{(j+1)}(z_i)$ is the (j+1)st-order output moment of the lower-order IIR filter $\hat{H}(z)$, which is yielded using the congruence transformation matrix $V_{j-1}$ (j>1) and matches j-order output moments of H(z) at $z_i$. The chosen expansion frequency in the jth iteration is called $z_{i^*_j}$.

After choosing the expansion point $z_{i^*_j}$ in the determined jth iteration, the single-point Arnoldi method is applied at the expansion point $z_{i^*_j}$ (unit 52), which contains steps 4 and 5, as shown in FIG. 4. Step 4, in FIG. 4, generates the new orthonormal vector $v_j$ and the vector is incorporated into the orthnormal matrix $V_{j-1}$. The normalization coefficient $h_\pi(z_i) = \Pi_j \|r^{(j-1)}(z_i)\|$ when $z_i$ is selected in the jth iteration.

Step 5, in FIG. 4, determines the new residual $r^{(j)}(z_i)$ at each expansion point $z_i$. The calculation involves a projection with the new orthonormal matrix $V_j$. The next vector $k^{(j)}(z_{i^*_{q+1}})$ at the frequency $z_{i^*_{q+1}}$ must be updated to enable further matching of the output moment in the (j+1)st iteration. Since no improvement is obtained at the other unselected frequency $z_i$, the vector $k^{(j)}(z_i)$ at frequency $z_i$ in the current iteration remains $k^{(j-1)}(z_i)$, which was obtained in the preceding iteration. Reset j=j+1 in step 6 and judge if j≦q in step 7, as shown in FIG. 4. Finally, the resulting orthogonal projection matrix $V_q$ is generated in step 8 in FIG. 4.

The resulting orthnormal matrix $V_q$ should be real to ensure that real system matrices of the lower-order IIR filter are generated if the complex expansion frequencies are used. First, all column vectors in $V_q$ are divided into the real part $V_r$ and the imaginary part $V_i$. Second, a reduced QR factorization of $[V_r\ V_i]$ is performed to yield a new orthogonal matrix $V_q$. The moment matching property of the resulting lower-order IIR filter by the new and real $V_q$ is also preserved.

The details of the algorithm are outlined as follows. The vector Z includes $\hat{i}$ expansion points, q is the total number of iterations and $V_q$ is the resulting orthonormal matrix.

| Adaptive Rational Arnoldi (input: A,b,c,Z,q; output: $V_q$) |
|---|
| (1): /* Initialize */ |
| 1 for each $z_i \in Z$ do |
| 2     $k^{(0)}(z_i) := (z_i I_n - A)^{-1} b$, $r^{(0)}(z_i) := k^{(0)}(z_i)$ |
| 3     $h_\pi(z_i) := 1$ |
| 4 end for |
| (2): /* Begin the Iterations */ |
| 5 for j = 1, 2, ..., q do |
|     (2.1) /* Select the Expansion Frequency with the Maximum Output Moment Error*/ |
| 6     Choose $z_i \in Z$ as the i giving $\max_i |h_\pi(z_i) c^T r^{(j-1)}(z_i)|$ |
| 7     set $z_{i^*_j}$ be the expansion frequency in the jth iteration |
|     (2.2) /*Generate the Orthonormal Vector at $z_{i^*_j}$ */ |
| 8     $h_{j,j-1}(z_{i^*_j}) := \|r^{(j-1)}(z_{i^*_j})\|$ |
| 9     $v_j := r^{(j-1)}(z_{i^*_j})/h_{j,j-1}(z_{i^*_j})$ |
| 10    $h_\pi(z_{i^*_j}) := h_\pi(z_{i^*_j}) \cdot h_{j,j-1}(z_{i^*_j})$ |
|     (2.3) /* Update the Residue $r^{(j)}(z_i)$ for the Next Iteration */ |
| 11    for each $z_i \in Z$ do |
| 12       if ($z_i == z_{i^*_j}$) then $k^{(j)}(z_{i^*_j}) := -(z_i I_n - A)^{-1} v_j$ |
| 13       else $k^{(j)}(z_i) := k^{(j-1)}(z_i)$ |
| 14       end if |
| 15       $r^{(j)}(z_i) := k^{(j)}(z_i)$ |
| 16       for t = 1, 2, ..., j do |
| 17          $h_{t,j}(z_i) := v_t^H r^{(j)}(z_i)$ |
| 18          $r^{(j)}(z_i) := r^{(j)}(z_i) - h_{t,j}(z_i) v_t$ |
| 19       end for |
| 20    end for |
| 21 end for |
| 22 $V_q = [V_1\ V_2\ \ldots\ V_q]$ |

Some properties of the method of approximating an FIR filter by low-order IIR filters in the invention are summarized as follows.

(1) Exact expression of output moment errors: suppose that the output moments of the original FIR filter and those of the lower-order IIR filter are matched, that is, $H^{(j)}(z_i)=\hat{H}^{(j)}(z_i)$ for j=0,1, ..., $\hat{j}_i-1$ and i=1,2, ..., $\hat{i}$. The system matrices of the lower-order IIR filter are generated by the congruence transformation with the orthonormal matrix $V_q$ using the algorithm, where $q=\sum_{i=1}^{\hat{i}}\hat{j}_i$. The magnitude error between the $\hat{j}_i$th-order moments $H^{(\hat{j}_i)}(z_i)$ and $\hat{H}^{(\hat{j}_i)}(z_i)$ at each expansion point $z_i$ can be expressed as follows:

$$|H^{(\hat{j}_i)}(z_i) - \hat{H}^{(\hat{j}_i)}(z_i)| = |h_\pi c^T r^{(j-1)}(z_i)|, \quad (10)$$

where $h_\pi(z_i) = \Pi_j \|r^{(j-1)}(z_i)\|$.

(2) Moment matching can still be preserved.

(3) In the first iteration in the rational Arnodli algorithm with adaptive orders, step (2.2) is to choose $z_i \epsilon Z$ such that $\max(|c^T(z_iI_n-A)^{-1}b|)=\max(|H(z_i)|)$. This is equivalent to find out the expansion frequency with the maximum magnitude in the output frequency response.

(4) Implementation issues of digital filters: the present invention also provides several heuristics of selecting expansion frequencies in advance for the proposed rational Arnoldi method. Generally speaking, the complex expansion points $\{z_1, z_2, \ldots, z_{\hat{i}}\}$ will be recommended, where each $z_i = e^{j\omega_i} \epsilon C$ and $0 \leq \omega_i \leq \pi$. Then the frequency responses of the lower-order IIR filters at these points can be the same as those of the original FIR filter. Nevertheless, if real expansion points can be selected, the computational complexity of yielding approximate IIR filters can be further reduced. The following guidelines are provided:

(a) Low-pass/high-pass filters: the proposed method with the expansion point $\omega_1=0$ performs well over the low frequency range of responses. For high-pass filter designs, the special structures of state-space matrices may be used to present the duality between low-pass and high-pass filters. Let $\overline{A}=-A$, $\overline{b}=b$, $\overline{c}=c$, and $\overline{h}_0=-h_0$, $$\overline{H}(z) = \overline{c}^T(zI_n - \overline{A})^{-1}\overline{b} + \overline{h}_0 = \sum_{i=0}^{n}(-1)^{i+1}h_i z^{-i}.$$

If $H(z)$ presents a high-pass filter, then $\overline{H}(z)$ will be a low-pass filter, and a vice versa. Likewise, the expansion point $\omega_1=0$ is chosen to perform the Arnoldi algorithm. If the corresponding orthonormal matrix $\nabla_q$ is obtained, then the high-pass IIR filter, which satisfies the same specifications as the original FIR filter, can be constructed as follows:

$\hat{A} = \nabla_q^T A \nabla_q$, $\hat{b} = \nabla_q^T b$, and $\hat{c} = \nabla_q^T c$.

(b) Band-pass/band-stop filters: experimental results indicate that the passband edge and stopband edge frequencies are appropriate candidate expansion points in meeting the specifications of the design. Other expansion points with uniform spacing are also recommend to be selected.

DESIGN EXAMPLES

Three example filters are used to justify the proposed approach. Table 1 describes specifications of a low-pass filter, a high-pass filter, and a band-pass filter. The command remez in Matlab was used to design the FIR filters by the optimal equiripple technique. Table 2 lists the corresponding orders. Then, the approximate low-order IIR filters were generated by the proposed method and the balanced realization method (BAL). Table 2 shows the reduced orders and the expansion points used by the two methods. FIGS. 5A-7C display the bode plots of the magnitude, the error in magnitude, and the phase of the original FIR filters and the low-order IIR filters. In FIGS. 5A-7C, the responses of the original FIR filters are represented as thin solid lines. Those of the IIR filters, determined by the proposed method, are represented as thick solid lines -, and those determined by BAL method are plotted as thick dashed lines - -. The responses in the passband of the IIR filters are indistinguishable from those of the original FIR filters, independently of which the model reduction method is used. Simulation results imply that the performance of the proposed method is similar to that of the BAL method in the passband. The resulting lower-order IIR filters can actually preserve the linear-phase response of the original FIR filters. Nevertheless, in terms of computational efficiency, the Kylov subspace based methods generally outperform the BAL method.

TABLE 1

Filter design specifications

| | Specifications | | |
|---|---|---|---|
| | Low-Pass | High-Pass | Band-Pass |
| Maximum passband attenuation (dB) | 3 | 1 | 1 |
| Maximum stopband attenuation (dB) | 40 | 35 | 35 |
| Lower passband edge (rad/s) | 0 | $0.85\pi$ | $0.3255\pi$ |
| Upper passband edge (rad/s) | $0.285\pi$ | $1\pi$ | $0.3755\pi$ |
| Lower stopband edge (rad/s) | $0.353\pi$ | 0 | $0.6655\pi$ |
| Upper stopband edge (rad/s) | $1\pi$ | $0.78\pi$ | $0.7155\pi$ |

TABLE 2

Matched orders and expansion points for IIR filter designs

| | | Low-Pass | High-Pass | Band-Pass |
|---|---|---|---|---|
| FIR | Order | 41 | 41 | 58 |
| IIR | Order | 24 | 17 | 36 |
| | Expansion points | $\omega = 0$ | | $\omega = \{0.4\pi, 0.6\pi\}$ |

CONCLUSIONS

A rational Arnoldi method with adaptive orders for approximating FIR filters by low-order linear-phase IIR filters has been proposed. The developed method is very efficient in terms of computational complexity. Meanwhile, the lower-order IIR filter can truly reflect the dynamical features of the FIR filter and satisfies the original design specifications.

Although the invention has been explained in relation to its preferred embodiment, it is to be understood that many other possible modifications and variations can be made without departing from the spirit and scope of the invention as hereinafter claimed.

What is claimed is:

1. A method of approximating an FIR filter with low-order linear-phase IIR filters by the rational Arnoldi algorithm with adaptive orders containing the following steps:
   a) initialize the first vector of the Krylov sequence for each expansion point;
   b) in the jth iteration of the algorithm, choosing an expansion frequency wherein the heuristics of selecting expansion frequencies in advance for the proposed rational Arnoldi method we given by
      (a) low-pass filters: the proposed method with the expansion point $\omega_1=0$;
      (b) high-pass filters: the special structures of state-space matrices used to present the duality between low-pass and light pass filters; let state matrices become $\overline{A}=-A$, $\overline{b}=b$, $\overline{c}=c$, and $\overline{h}_0=-h_0$, the expansion point $\omega_1=0$ chosen to perform the Arnoldi algorithm; when the corresponding orthonormal matrix $\nabla_q$ is obtained and then the high-pass IIR filter, which satisfies the same specifications as the original FIR filter; and
      (c) band-pass/band-stop filters: the passband edge and the stopband edge frequencies being the appropriate candidate expansion points in meeting the specifications of the design, and other expansion points with uniform spacing recommended to be selected such that the frequency gives the greatest difference between the (j+1)st-order output moment of the original FIR filter H(z) and that of the lower-order IIR filter Ĥ(z) wherein the expression of output moment errors between the $\hat{j}_i$th-order moments $H^{(\hat{j}_i)}(z_i)$ and $\hat{H}^{(\hat{j}_i)}(z_i)$ at each expansion point $z_i$ are expressed as follows:

$$|H^{(\hat{j}_i)}(z_i) - \hat{H}^{(\hat{j}_i)}(z_i)| = |h_\pi c^T r^{(\hat{j}_i-1)}(z_i)|,$$

where $$h_\pi(z_i) = \prod_j \|r^{(j-1)}(z_i)\|$$

is the normalization coefficient when an expansion frequency $z_i$ is selected in the jth iteration; vector c contains the last n impulse response coefficients of a FIR filter with length n+1; and $r^{(j-1)}(z_i)$ is the residual vector in the (j−1)st iteration of the disclosed adaptive rational Arnoldi algorithm at the expansion frequency $z_i$;

c) after the choosing the expansion point in jth iteration being determined, the single-point Arnoldi method applied at the expansion point to generate the new orthnormal vector; and d) determine a new residual at each expansion point for next iteration;

whereby, after the giving total iteration number of the algorithm, outputting the resulting orthogonal projection matrix.

* * * * *